(12) United States Patent
Chen et al.

(10) Patent No.: US 12,368,115 B2
(45) Date of Patent: *Jul. 22, 2025

(54) SUPPORTING InFO PACKAGES TO REDUCE WARPAGE

(71) Applicant: Taiwan Semiconductor Manufacturing Co., Ltd., Hsinchu (TW)

(72) Inventors: Jie Chen, New Taipei (TW); Ying-Ju Chen, Tuku Township (TW); Hsien-Wei Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/357,421

(22) Filed: Jul. 24, 2023

(65) Prior Publication Data

US 2023/0369247 A1    Nov. 16, 2023

Related U.S. Application Data

(60) Continuation of application No. 17/140,734, filed on Jan. 4, 2021, now Pat. No. 11,764,165, which is a division of application No. 16/576,375, filed on Sep. 19, 2019, now Pat. No. 10,886,238, which is a division of application No. 16/027,580, filed on Jul. 5, 2018, now Pat. No. 10,651,131.

(60) Provisional application No. 62/692,115, filed on Jun. 29, 2018.

(51) Int. Cl.
*H01L 21/683* (2006.01)
*H01L 21/48* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC ............... H01L 23/562; H01L 23/5381; H01L 21/4853
See application file for complete search history.

(56) References Cited

U.S. PATENT DOCUMENTS 7,030,494 B2    4/2006  Aoki
7,247,950 B2    7/2007  Fujisawa et al.
(Continued)

FOREIGN PATENT DOCUMENTS

CN    103715104 A    4/2014
CN    104733436 A    6/2015
(Continued)

*Primary Examiner* — Dale E Page
*Assistant Examiner* — Wilner Jean Baptiste
(74) *Attorney, Agent, or Firm* — Slater Matsil, LLP

(57) ABSTRACT

A method includes encapsulating a first device die and a second device die in an encapsulating material, forming redistribution lines over and electrically coupling to the first device die and the second device die, and bonding a bridge die over the redistribution lines to form a package, with the package including the first device die, the second device die, and the bridge die. The bridge die electrically inter-couples the first device die and the second device die. The first device die, the second device die, and the bridge die are supported with a dummy support die.

20 Claims, 23 Drawing Sheets

(51) Int. Cl.
    *H01L 21/56* (2006.01)
    *H01L 23/00* (2006.01)
    *H01L 23/31* (2006.01)
    *H01L 23/538* (2006.01)

(52) U.S. Cl.
    CPC .......... *H01L 21/561* (2013.01); *H01L 21/565* (2013.01); *H01L 21/568* (2013.01); *H01L 21/6835* (2013.01); *H01L 23/3128* (2013.01); *H01L 23/5381* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 24/96* (2013.01); *H01L 2221/68372* (2013.01); *H01L 2224/214* (2013.01); *H01L 2224/95001* (2013.01); *H01L 2924/3511* (2013.01)

(56) References Cited

U.S. PATENT DOCUMENTS

| | | |
|---|---|---|
| 8,008,130 B2 | 8/2011 | Honda |
| 9,305,902 B1 | 4/2016 | Lin |
| 9,613,931 B2 | 4/2017 | Lin et al. |
| 9,953,904 B1* | 4/2018 | Oratti Kalandar .. H01L 23/3114 |
| 10,068,852 B2 | 9/2018 | Mahajan et al. |
| 10,163,780 B2 | 12/2018 | Yu et al. |
| 10,297,518 B2 | 5/2019 | Lin et al. |
| 10,325,841 B2 | 6/2019 | Nakagawa et al. |
| 10,811,394 B2 | 10/2020 | Yu et al. |
| 11,764,165 B2* | 9/2023 | Chen .................. H01L 25/0655 257/668 |
| 2011/0062578 A1 | 3/2011 | Katagiri et al. |
| 2016/0155705 A1* | 6/2016 | Mahajan ............... H01L 21/568 438/107 |
| 2017/0194292 A1 | 7/2017 | Yu et al. |
| 2017/0345741 A1 | 11/2017 | Wu et al. |
| 2018/0082988 A1 | 5/2018 | Cheng et al. |

FOREIGN PATENT DOCUMENTS

| | | |
|---|---|---|
| CN | 106952831 A | 7/2017 |
| DE | 102014116417 A1 | 6/2015 |
| JP | 2001177010 A | 6/2001 |
| JP | 2005026269 A | 1/2005 |
| JP | 2011061116 A | 3/2011 |
| KR | 20060005969 A | 1/2006 |
| TW | 201639106 A | 11/2016 |
| TW | 201727845 A | 8/2017 |
| TW | 201740537 A | 11/2017 |

* cited by examiner

SUPPORTING InFO PACKAGES TO REDUCE WARPAGE

PRIORITY CLAIM AND CROSS-REFERENCE

This application is a continuation of U.S. patent application Ser. No. 17/140,734, entitled "Supporting InFO Packages to Reduce Warpage," filed Jan. 4, 2021, which is a divisional of U.S. patent application Ser. No. 16/576,375, entitled "Supporting InFO Packages to Reduce Warpage," filed Sep. 19, 2019, now U.S. Pat. No. 10,886,238 issued Jan. 5, 2021, which is a divisional of U.S. patent application Ser. No. 16/027,580, filed Jul. 5, 2018, and entitled "Supporting InFO Packages to Reduce Warpage," now U.S. Pat. No. 10,651,131 issued May 12, 2020, which claims the benefit of the U.S. Provisional Application No. 62/692,115, filed Jun. 29, 2018, and entitled "Supporting InFO Packages to Reduce Warpage," which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies. The fan-out packages suffer from warpages. This causes difficulty in the bonding of the fan-out packages to package substrate, and the respective solder join may fail.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 7A illustrate the cross-sectional views of intermediate stages in the formation of an Integrated Fan-Out (InFO) package in accordance with some embodiments.

DETAILED DESCRIPTION

Figure 1:
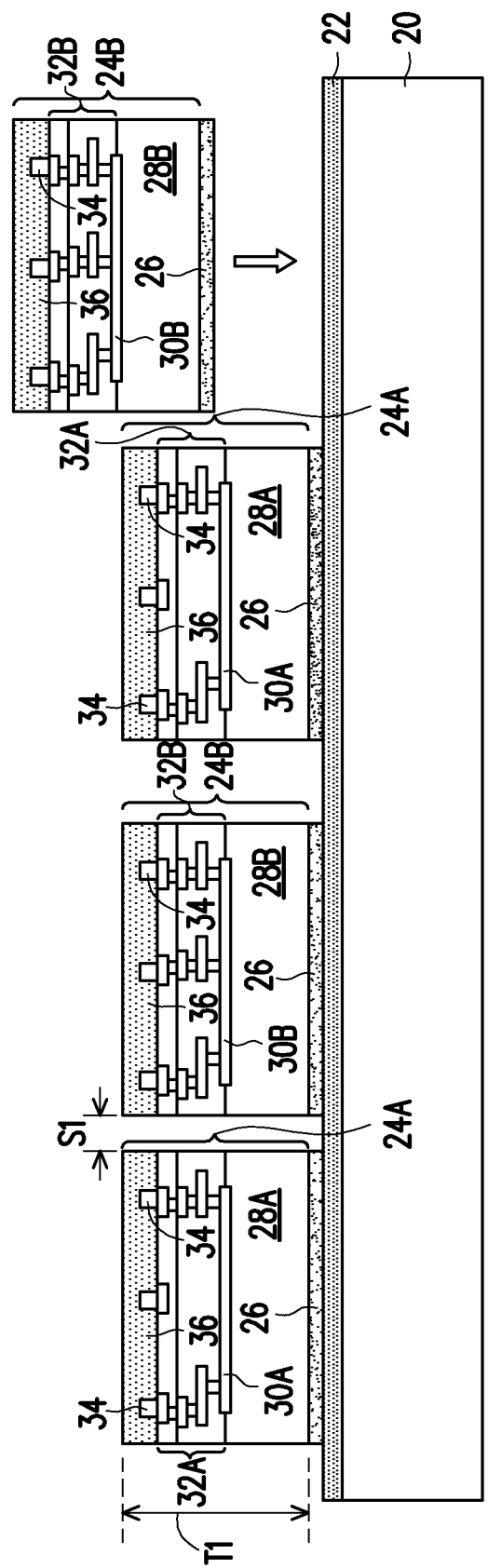

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out (InFO) package and methods of forming the same are provided in accordance with various embodiments. The intermediate stages of forming the InFO package are illustrated in accordance with some embodiments. Some variations of some embodiments are discussed. Throughout the various views and illustrative embodiments, like reference numbers are used to designate like elements.

Figure 19:
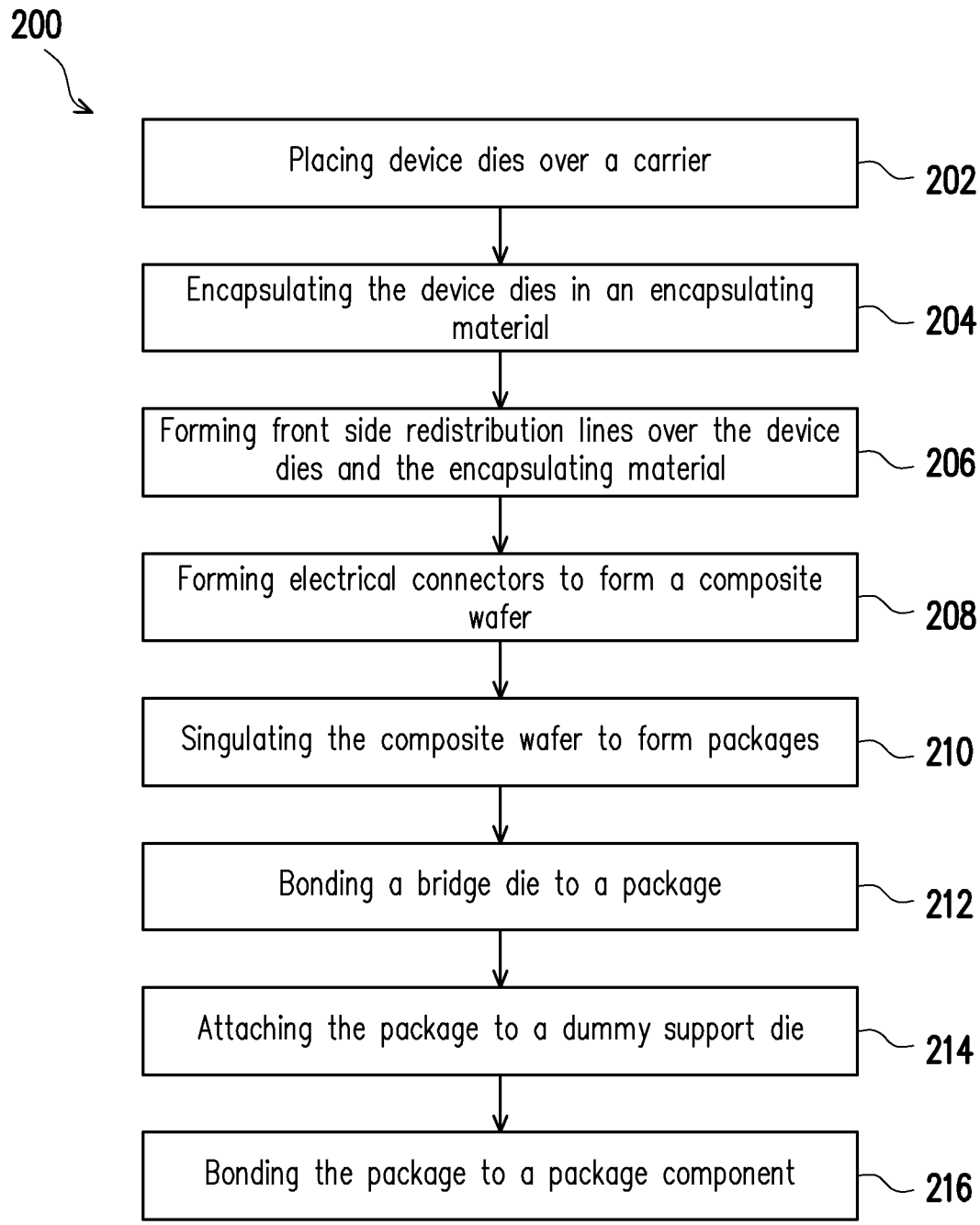
FIG. 19 illustrates a process flow for forming an InFO package in accordance with some embodiments.

FIGS. 1 through 7A illustrate the cross-sectional views of intermediate stages in the formation of an InFO package in accordance with some embodiments of the present disclosure. The steps shown in FIGS. 1 through 7A are also reflected schematically in the process flow 200 as shown in FIG. 19.

Referring to FIG. 1, carrier 20 is provided, and release film 22 is coated on carrier 20. Carrier 20 may be formed of a transparent material, and may be a glass carrier, a ceramic carrier, an organic carrier, or the like. Carrier 20 may have a round top-view shape, and may have a size of a silicon wafer. For example, carrier 20 may have an 8-inch diameter, a 12-inch diameter, or the like. Release film 22 is over the top surface of carrier 20. Release film 22 may be formed of a Light-To-Heat-Conversion (LTHC) coating material. Release film 22 may be applied onto carrier 20 through coating. In accordance with some embodiments of the present disclosure, the LTHC coating is capable of being decomposed under the heat of light/radiation (such as laser), and hence can release carrier 20 from the structure formed thereon. In accordance with some embodiments of the present disclosure, LTHC coating 22 includes carbon black (carbon particles), a solvent, a silicon filler, and/or an epoxy. The epoxy may include polyimide or another polymer such as Acrylic.

FIG. 1 illustrates the placement/attachment of devices 24A and 24B onto carrier 20. The respective process is illustrated as process 202 in the process flow shown in FIG. 19. Devices 24A and 24B may be device dies, and hence are referred to as device dies 24A and 24B hereinafter, while devices 24A and 24B may also be other types of package components such as packages, integrated passive devices, or the like. Device dies 24A and 24B are attached to LTHC coating 22 through Die-Attach Films (DAFs) 26, which are adhesive films. DAFs 26 may be pre-attached on device dies 24A and 24B before device dies 24A and 24B are placed on LTHC coating 22. Device dies 24A and 24B may include semiconductor substrates 28A and 28B having back surfaces (the surfaces facing down) in physical contact with DAFs 26. Device dies 24A and 24B may include integrated circuit devices (such as active devices, which include transistors, for example) 30A and 30B at the front surfaces (the surfaces facing up) of semiconductor substrates 28A and 28B, respectively. In accordance with some embodiments of the present disclosure, one (or both) of device dies 24A and 24B is a logic die, which may be a Central Processing Unit (CPU) die, a Graphic Processing Unit (GPU) die, a mobile application die, a Micro Control Unit (MCU) die, an input-output (IO) die, a BaseBand (BB) die, or an Application Processor (AP) die. Device dies 24A and 24B may also include interconnect structures 32A and 32B, respectively, metal pillars 34, and dielectric layers 36. The distance S1 between device dies 24A and 24B may be greater than about 50 µm, and may be in the range between about 50 µm and about 780 µm. Thicknesses T1 of device die 24A and 24B may be smaller than about 730 µm.

In accordance with some embodiments, metal pillars 34 (such as copper pillars) are pre-formed as parts of device dies 24A and 24B, and metal pillars 34 are electrically coupled to the integrated circuit devices 30A and 30B. In accordance with some embodiments of the present disclosure, dielectric layer 36 fills the gaps between neighboring metal pillars 34 to form top dielectric layers. Top dielectric layers 36 may also include portions covering and protecting metal pillars 34. Top dielectric layers 36 may be formed of a polymer such as polybenzoxazole (PBO) or polyimide in accordance with some embodiments of the present disclosure.

Figure 2:
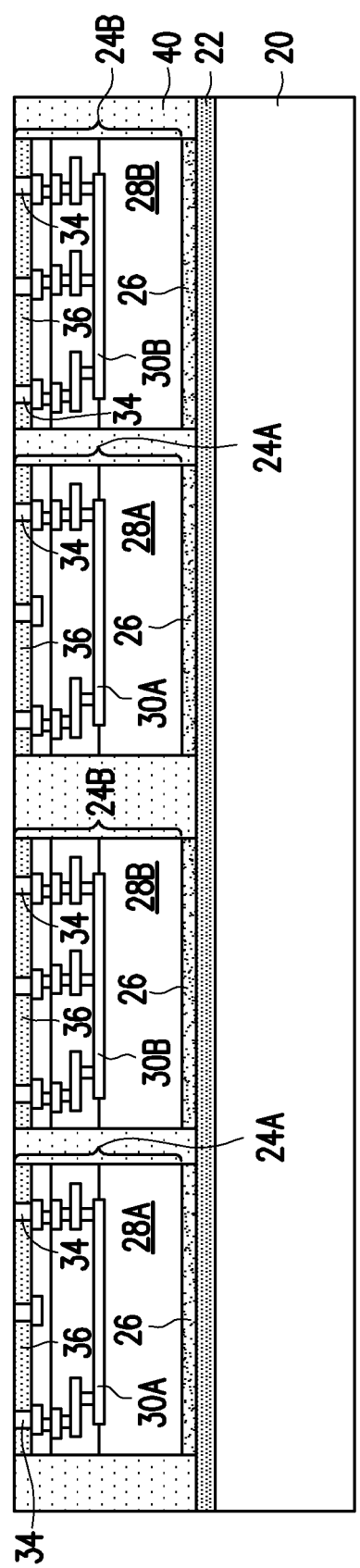

Next, referring to FIG. 2, device dies 24A and 24B are encapsulated in encapsulating material 40. The respective process is illustrated as process 204 in the process flow shown in FIG. 19. Encapsulating material 40 fills the gaps between device dies 24A and 24B. Encapsulating material 40 may include a molding compound, a molding underfill, an epoxy, and/or a resin. The top surface of encapsulating material 40 may be higher than the top ends of metal pillars 34 at the time device dies 24A and 24B are encapsulated. Encapsulating material 40 may include a base material, which may be a polymer, a resin, an epoxy, or the like, and filler particles (not shown) in the base material. The filler particles and the base material may be similar to filler particles 40A and base material 40B in FIG. 15. The filler particles may be dielectric particles of $SiO_2$, $Al_2O_3$, silica, or the like, and may have spherical shapes. Also, the spherical filler particles may have the same or different diameters.

In a subsequent step, as also shown in FIG. 2, a planarization process such as a Chemical Mechanical Polish (CMP) process or a mechanical grinding process is performed to thin encapsulating material 40 and dielectric layers 36, until metal pillars 34 are exposed. Due to the planarization process, the top surfaces of metal pillars 34 are substantially coplanar with the top surface of encapsulating material 40.

Figure 3:
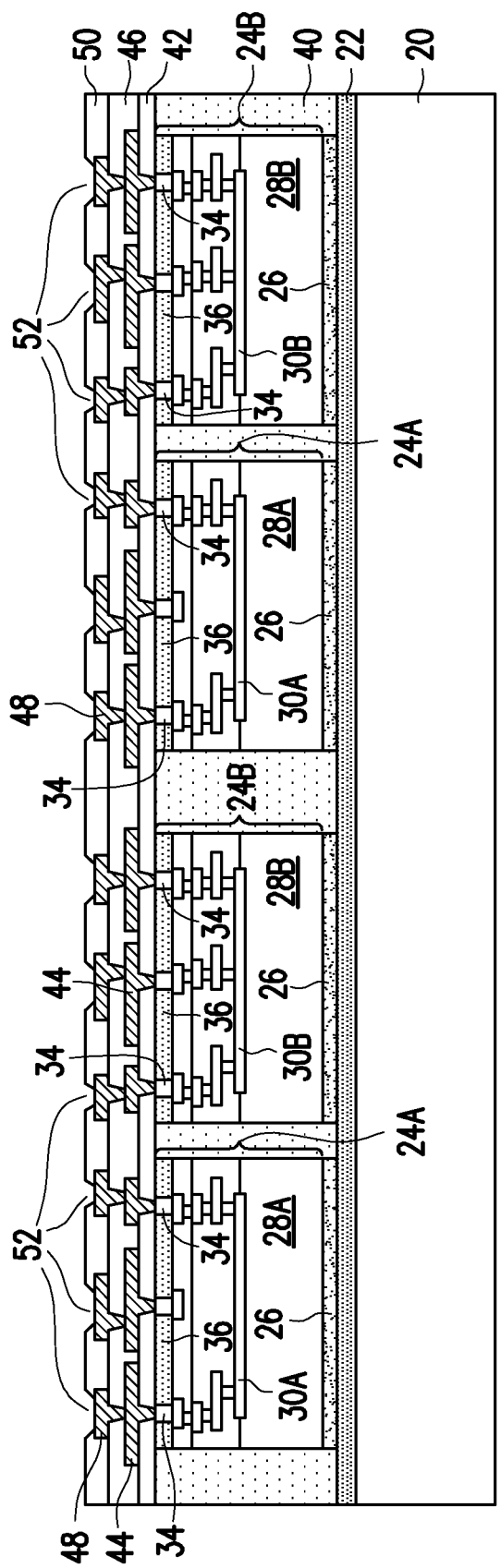

FIG. 3 illustrates the formation of a front-side redistribution structure, which includes one or more layers of Redistribution Lines (RDLs) and the respective dielectric layers. The respective process is illustrated as process 206 in the process flow shown in FIG. 19. Referring to FIG. 3, dielectric layer 42 is formed first. In accordance with some embodiments of the present disclosure, dielectric layer 42 is formed of a polymer such as PBO, polyimide, or the like. The formation process includes coating dielectric layer 42 in a flowable form, and then curing dielectric layer 42. In accordance with alternative embodiments of the present disclosure, dielectric layer 42 is formed of an inorganic dielectric material such as silicon nitride, silicon oxide, or the like. The formation method may include Chemical Vapor Deposition (CVD), Atomic Layer Deposition (ALD), Plasma-Enhanced Chemical Vapor Deposition (PECVD), or other applicable deposition methods. Openings (occupied by the via portions of RDLs 44) are then formed, for example, through a photo lithography process. In accordance with some embodiments in which dielectric layer 42 is formed of a photo sensitive material such as PBO, polyimide, or benzocyclobutene (BCB), the formation of the openings involves a photo exposure of dielectric layer 42 using a lithography mask (not shown), and developing dielectric layer 42. Metal pillars 34 are exposed through the openings.

RDLs 44 are formed over dielectric layer 42. RDLs 44 include via portions formed in dielectric layer 42 to connect to metal pillars 34, and metal trace portions over dielectric layer 42. In accordance with some embodiments of the present disclosure, RDLs 44 are formed in a plating process, which includes depositing a metal seed layer (not shown), forming and patterning a photo resist (not shown) over the metal seed layer, and plating a metallic material such as copper and/or aluminum over the metal seed layer. The metal seed layer and the plated metallic material may be formed of the same material or different materials. The patterned photo resist is then removed, followed by etching the portions of the metal seed layer previously covered by the patterned photo resist.

Dielectric layer 46 is then formed over RDLs 44, followed by the formation of openings in dielectric layer 46. Some portions of RDLs 44 are thus exposed through the openings. Dielectric layer 46 may be formed using a material selected from the same candidate materials for forming dielectric layer 42, which may include PBO, polyimide, BCB, or other organic or inorganic materials. RDLs 48 are then formed. RDLs 48 also include via portions extending into the openings in dielectric layer 46 to contact RDLs 44, and metal line portions directly over dielectric layer 46. The formation of RDLs 48 may be the same as the formation of RDLs 44, which includes forming a seed layer, forming a patterned mask, plating RDLs 48, and then removing the patterned mask and undesirable portions of the seed layer.

FIG. 3 also illustrates the formation of dielectric layer 50. Dielectric layer 50 may be formed of a material selected from the same group of candidate materials for forming dielectric layers 42 and 46. For example, dielectric layer 50 may be formed using PBO, polyimide, or BCB. Openings 52 are formed in dielectric layer 50 to expose the underlying metal pads, which are parts of RDLs 48 in the illustrative embodiments.

Figure 4:
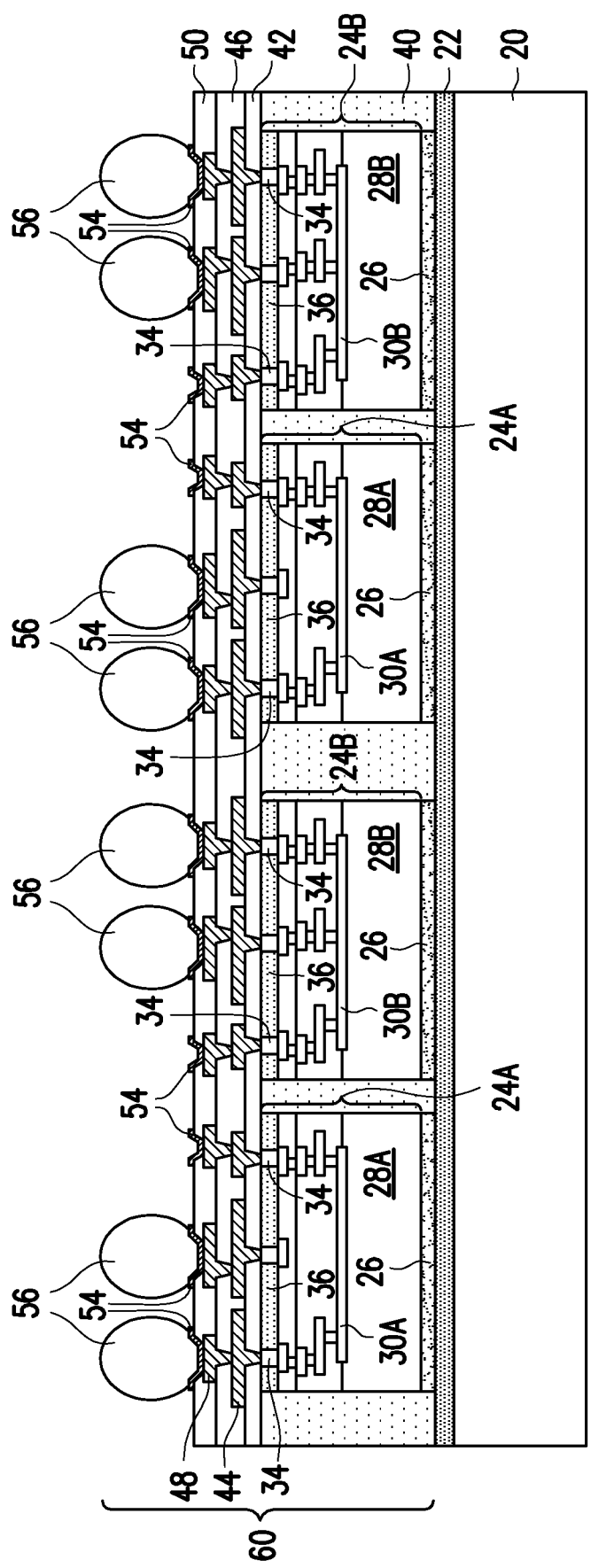

Referring to FIG. 4, in accordance with some embodiment of the present disclosure, UBMs 54 are formed to extend into the openings in dielectric layer 50 to contact the metal pads in RDLs 48. UBMs 54 may be formed of nickel, copper, titanium, or multi-layers thereof. In accordance with some embodiments, UBMs 54 include a titanium layer and a copper layer over the titanium layer. In accordance with some embodiments, as shown in FIG. 4, there are two layers of RDLs (44 and 48). In accordance with alternative embodiments, there is one layer of RDLs or three or more layers of RDLs.

Electrical connectors 56 are then formed. The respective process is illustrated as process 208 in the process flow shown in FIG. 19. The formation of electrical connectors 56 may include placing solder balls on the exposed portions of UBMs 54, and then reflowing the solder balls. As a result, electrical connectors 56 are solder regions, which are sometimes referred to as C4 bumps. In accordance with alternative embodiments of the present disclosure, the formation of electrical connectors 56 includes performing a plating step to form solder layers over UBMs 54, and then reflowing the solder layers. Electrical connectors 56 may also include non-solder metal pillars, or metal pillars and solder caps over the non-solder metal pillars, which may also be formed through plating. Throughout the description, the structure overlying release film 22 is referred to as package 60, which is a composite wafer (and also referred to as composite wafer 60 hereinafter) including a plurality of device dies 24A and 24B therein.

Figure 5:
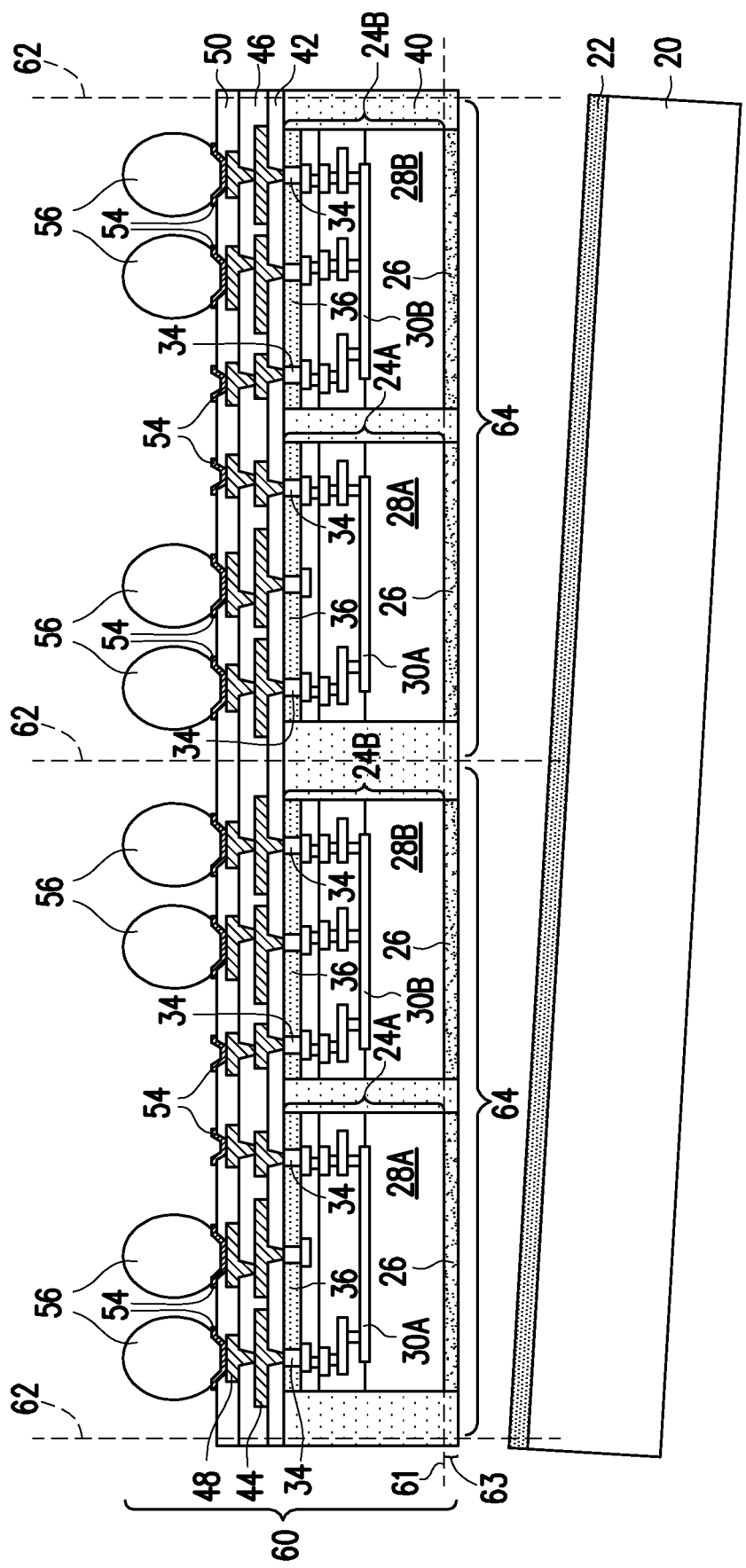
Figure 6:
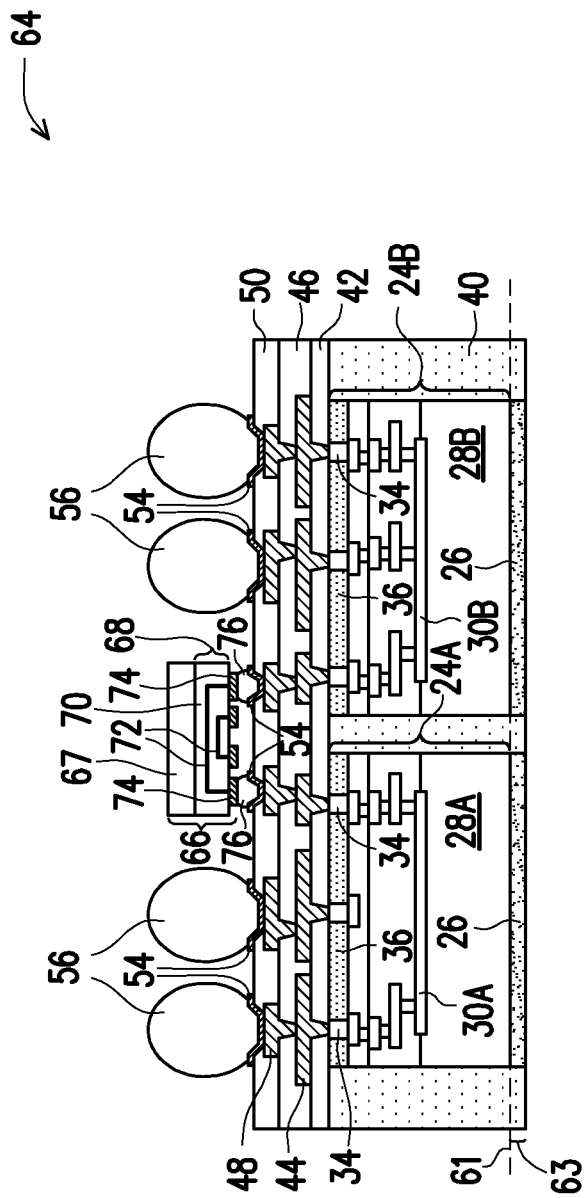

In subsequent steps, as shown in FIG. 5, composite wafer 60 is de-bonded from carrier 20. The de-bonding may include projecting a laser beam on release film 22, so that release film 22 is decomposed, and composite wafer 60 is detached from carrier 20. Composite wafer 60 is then sawed apart along scribe lines 62 into a plurality of packages 64, wherein one of packages 64 is shown in FIG. 6. The respective process is illustrated as process 210 in the process flow shown in FIG. 19. In accordance with some embodiments, a grinding process is performed to remove DAFs 26. The grinding process may be performed on composite wafer 60 so that the portion 63 of composite wafer 60 underlying dashed line 61 is removed. In accordance with other embodiments, the grinding process is not performed. Accordingly, package 64 may or may not include portion 63.

FIG. 6 illustrates the bonding of bridge die 66 to package 64. The respective process is illustrated as process 212 in the process flow shown in FIG. 19. In accordance with some embodiments of the present disclosure, bridge die 66 is attached to UBMs 54 through solder regions 76. In accordance with some embodiments of the present disclosure, bridge die 66 is free from active devices such as transistors and diodes. Bridge die 66 may or may not be free from passive devices such as capacitors, transformers, inductors, resistors, and the like. In accordance with alternative embodiments of the present disclosure, bridge die 66 includes some active devices and/or passive devices (not shown), and the active devices may be formed at the top surfaces of semiconductor substrates 67.

Bridge die 66 may include substrate 67 and interconnect structure 68. Substrate 67 may be a semiconductor substrate (such as a silicon substrate, a silicon carbon substrate, or the like) or a dielectric substrate such as a silicon oxide substrate. Interconnect structure 68 includes dielectric layers 70 and metal lines and vias 72 in dielectric layers 70. Dielectric layers 70 may include Inter-Metal Dielectric (IMD) layers. In accordance with some embodiments of the present disclosure, some of dielectric layers 70 are formed of low-k dielectric materials having dielectric constants (k-value) lower than about 3.0 or lower than about 2.5. Dielectric layers 70 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with some embodiments of the present disclosure, the formation of dielectric layers 70 includes depositing porogen-containing dielectric materials, and then performing a curing process to drive out the porogen, so that the remaining dielectric layers 70 are porous. Etch stop layers (not shown), which may be formed of silicon carbide, silicon nitride, or the like, are formed between IMD layers 70, and are not shown for simplicity.

Metal lines and vias 72 are formed in dielectric layers 70. The formation process may include single damascene and dual damascene processes. Bridge die 66 may further include passivation layers (also denoted as 70). The passivation layers have the function of isolating the low-k dielectric layers (if any) and metal lines/vias 72 from the adverse effect of detrimental chemicals and moisture. The passivation layers may be formed of non-low-k dielectric materials such as silicon oxide, silicon nitride, Undoped Silicate Glass (USG), or the like. There may be metal pads such as aluminum pads (which may be formed of aluminum copper, for example) in the passivation layers. Bond pads (or metal bumps) 74 are formed at the surface of bridge die 66. Bridge die 66 is bonded to UBMs 54, for example, through solder regions 76. An underfill (not shown) may be dispensed into the gaps between bridge die 66 and package 64.

Bridge die 66 electrically interconnects the metal pillars 34 of device die 24A to the metal pillars 34 of device die 24B. Furthermore, bridge die 66 may include a first portion overlapping device die 24A, and a second portion overlapping device die 24B. Bridge die 66 may be thin, for example, with a thickness smaller than about 50 μm.

Figure 7A:
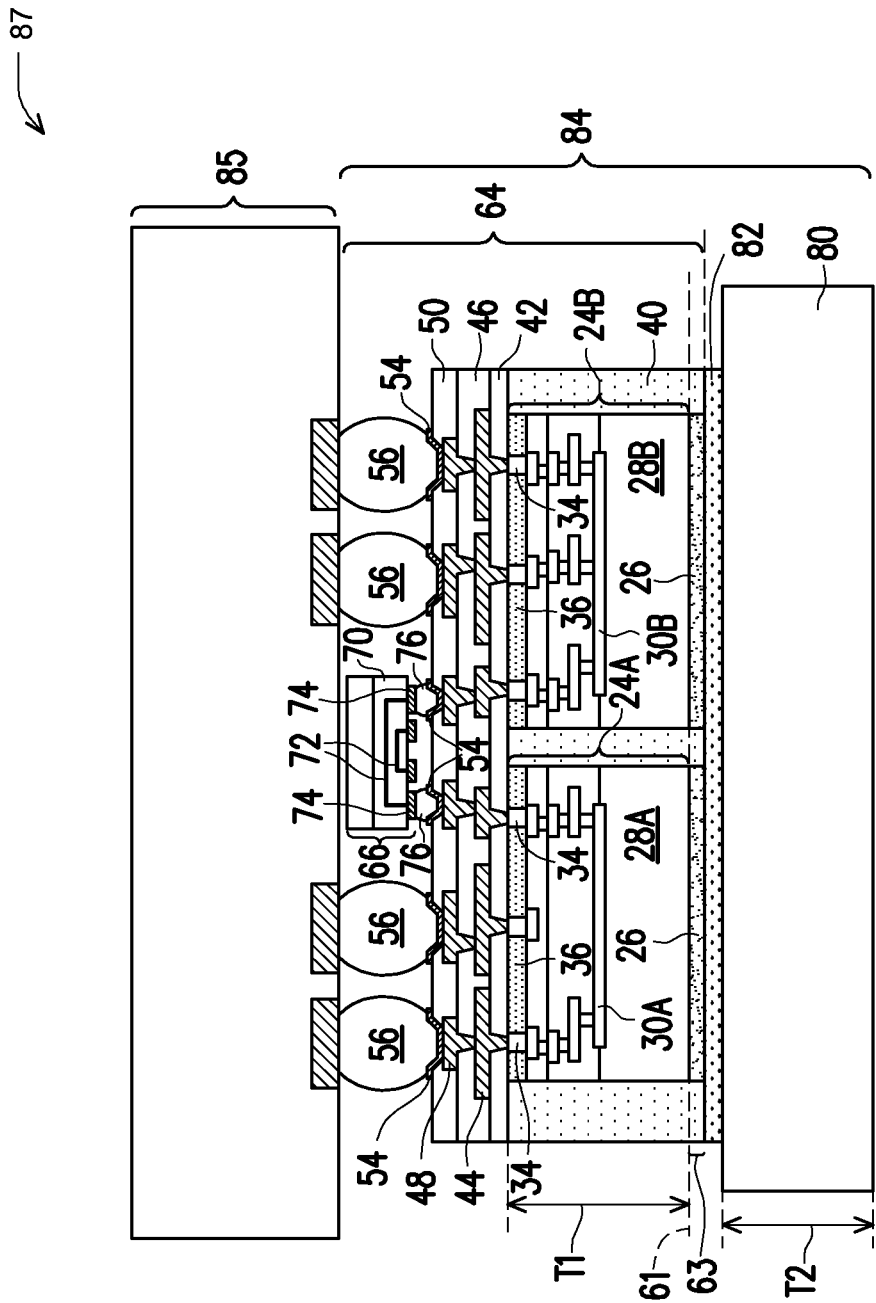

Referring to FIG. 7A, support die 80 is adhered to package 64 to form package 84. The respective process is illustrated as process 214 in the process flow shown in FIG. 19. Support die 80 is also referred to as a dummy support die throughout the description since it may be a blank die with no active devices (such as transistors and diodes) and passive devices (such as resistors, capacitors, and inductors) formed therein. Furthermore, support die 80 may not have any metal lines, vias, etc. formed therein. Support die 80 is formed of a rigid material, which may have a Young's modulus equal to or greater than the Young's modulus of silicon (about 165 GPa to about 179 GPa). The thickness T2 of dummy support die 80 is great enough to provide adequate mechanical support to the overlying package 64, so that the warpage of package 64 is reduced to a desirable value. Thickness T2 may be greater than about 50 µm, and may be in the range between about 50 µm and about 730 µm. Furthermore, the total thickness (T1+T2) of device dies 24A/24B and dummy support die 80 may be smaller than about 780 µm.

In addition, dummy support die 80 may have a good thermal conductivity. The thermal conductivity of dummy support die 80 may be close to (for example, greater than 90 percent of) the thermal conductivity of the semiconductor substrates (such as silicon substrates) in the overlying device dies. For example, silicon has a thermal conductivity equal to about 148 W/(m*K), and hence the thermal conductivity of dummy support die 80 may be greater than about 135 W/(m*K) or higher. With dummy support die 80 having a high thermal conductivity, the thermal dissipation in the resulting structure is improved.

In accordance with some embodiments of the present disclosure, dummy support die 80 is formed of a metal or a metal alloy, a semiconductor material, or a dielectric material. For example, when including metal, dummy support die 80 may be formed of copper, aluminum, nickel, stainless steel, or the like, and hence is a metal film/plate in accordance with some embodiments. When formed of a semiconductor material, dummy support die 80 may be a blank silicon die. When formed of a dielectric material, dummy support die 80 may be formed of ceramic. In addition, the material of dummy support die 80 may be homogenous. For example, the entire dummy support die 80 may be formed of the same material, which includes same elements in all parts of dummy support die 80, and the atomic percentages of the elements may be uniform throughout dummy support die 80. In accordance with some embodiments in which dummy support die 80 is formed of silicon, a p-type or an n-type impurity doped in dummy support die 80. In accordance with alternative embodiments in which dummy support die 80 is formed of silicon, no p-type impurity and n-type impurity are doped in dummy support die 80.

In accordance with some embodiments, adhesive 82 is formed of a Thermal Interface Material (TIM), which has a relatively high thermal conductivity, for example, higher than about 1.0 W/(m*K) or higher than about 5.0 W/(m*K).

Package 64 is also bonded to package component 85, which may be a package substrate, a printed circuit board, a package, or the like. The respective process is illustrated as process 216 in the process flow shown in FIG. 19. The resulting package is referred to as package 87. The bonding of package component 85 to package 64 may be through electrical connectors 56, which may include solder regions. As shown in FIG. 7A, the molding compound 40 and the adhesive film 82 have corresponding edges (left edges and right edges) vertically aligned.

Figure 7B:
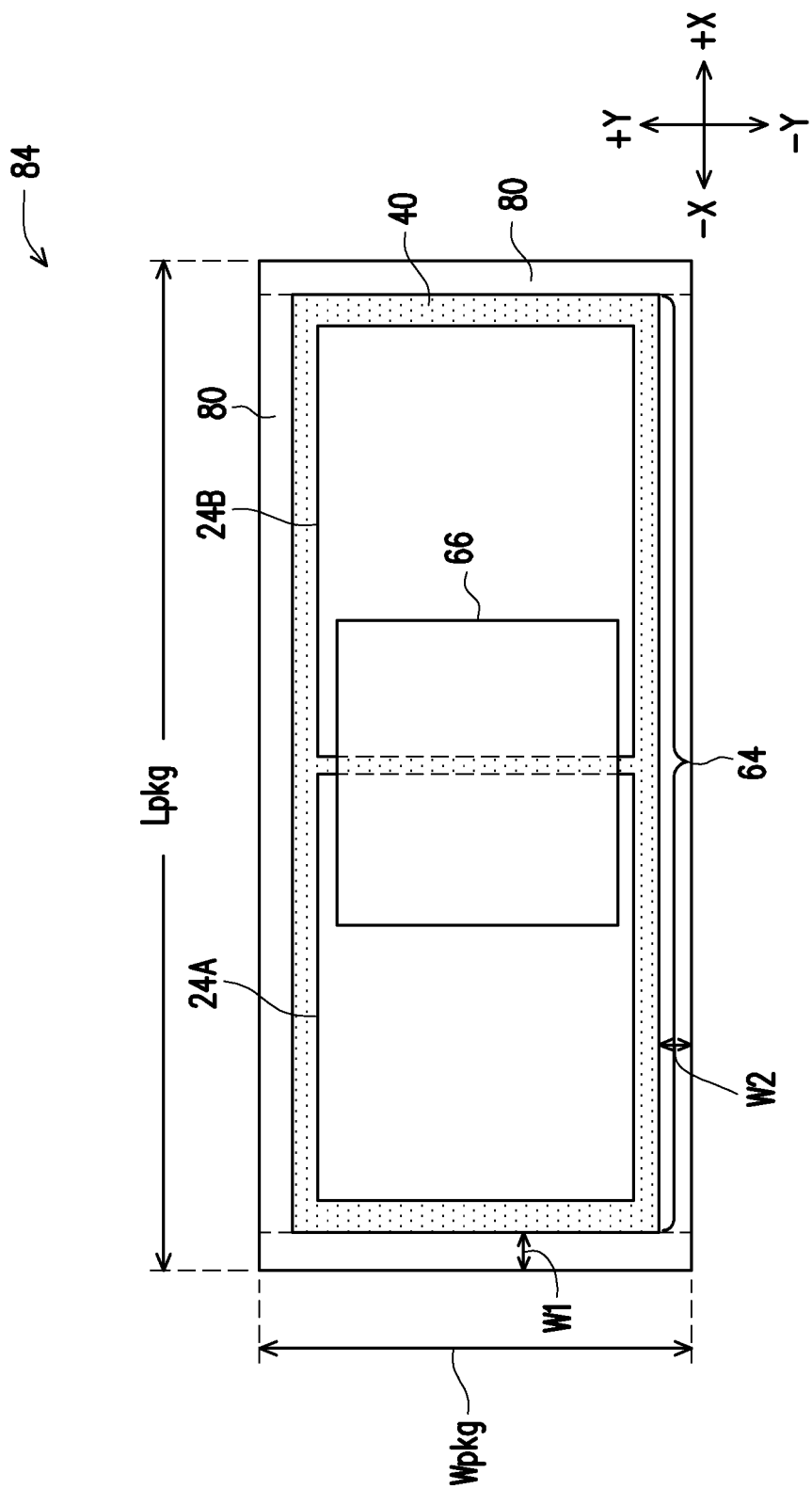
FIG. 7B illustrates a top view of an InFO package as show in FIG. 7A in accordance with some embodiments.

FIG. 7B illustrates a top view of some portions of package 84. In accordance with some embodiments, dummy support die 80 has extension portions extending beyond the edges of package 64 in four directions (+X, −X, +Y, and −Y), and the extension portions have extension widths W1 and W2. Extension width W1 and W2 may be greater than about 50 µm, and may be in the range between about 50 µm and about 100 µm. Increasing the length and the width of dummy support die 80 to be greater than the respective length and width of package 64 improves the resistance of package 84 to warpage.

In accordance with some embodiments, extension width W2 is equal to extension width W1. In accordance with some embodiments of the present disclosure, both package 64 and dummy support die 80 are elongated, with package 84 having length Lpkg and width Wpkg smaller than length Lpkg. For example, ratio Lpkg/Wpkg may be greater than about 1.5. The long side of the package 84 is more likely to warp than the short side, and (at least equal or) more support may be needed on the long side than on the short side. In accordance with some embodiments, extension width W2 is greater than extension width W1, so that dummy support die 80 (and package 84) is less elongated than package 64. In accordance with some embodiments of the present disclosure, both extension widths W1 and W2 have non-zero values. Ratio W2/W1 may be equal to or greater than ratio Lpkg/Wpkg to provide adequate compensation for the difference between length Lpkg and width Wpkg. For example, ratio W2/W1 may be greater than about 1.5.

In accordance with other embodiments, width W2 is greater than about 50 µm, and may be in the range between about 50 µm and about 100 µm. Width W1, on the other hand, is equal to 0 µm. This improves the resistance of the elongated package 84 to warpage without excessively increasing the footage of package 84.

Figure 20:
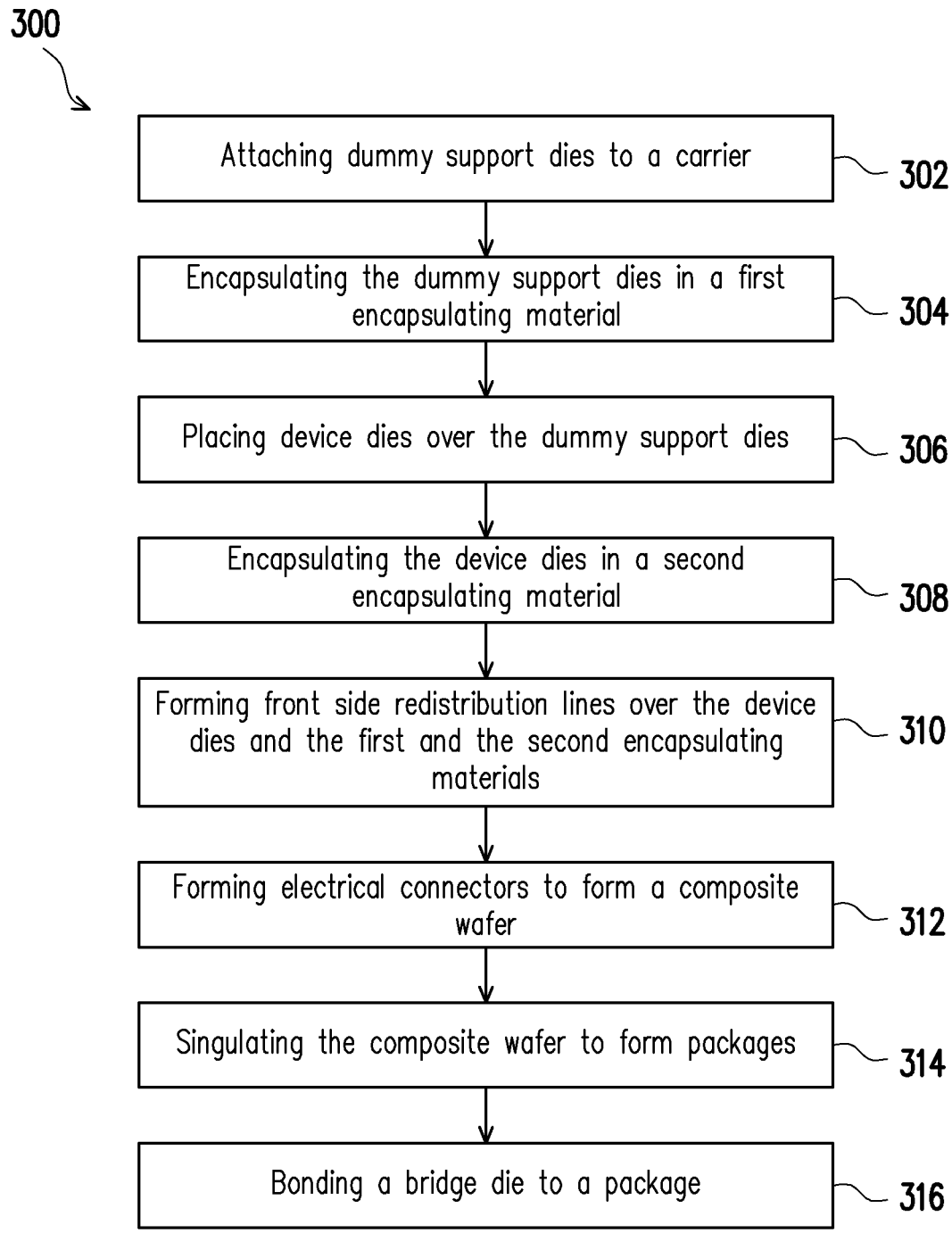
FIG. 20 illustrates a process flow for forming an InFO package in accordance with some embodiments.

FIGS. 8 through 14A illustrate the cross-sectional views of intermediate stages in the formation of an InFO package in accordance with some embodiments of the present disclosure. Unless specified otherwise, the materials and the formation methods of the components in these embodiments are essentially the same as the like components, which are denoted by like reference numerals in the embodiments shown in FIGS. 1 through 7A and 7B. The details regarding the formation process and the materials of the components shown in FIGS. 8 through 14A and 14B may thus be found in the discussion of the embodiments shown in FIGS. 1 through 7A and 7B. The steps shown in FIGS. 8 through 14A are also reflected schematically in the process flow 300 shown in FIG. 20.

Figure 8:
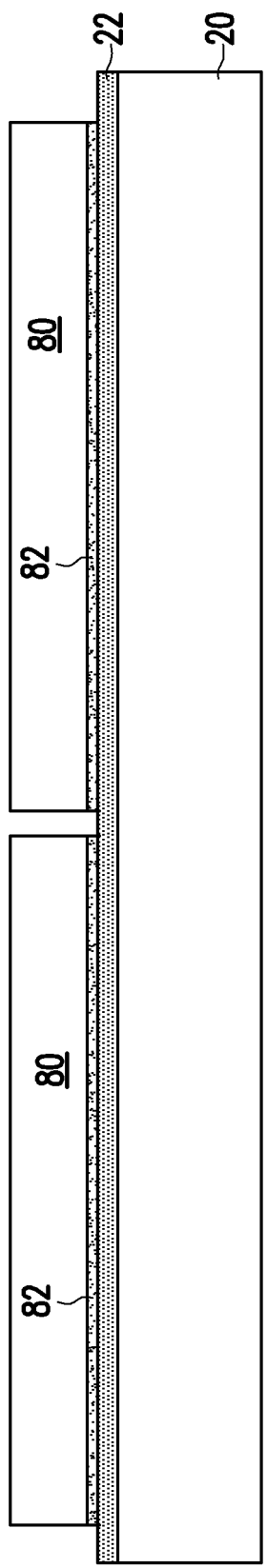
FIGS. 8, 9A, 9B, 10-13 and 14A illustrate the cross-sectional views of intermediate stages in the formation of an InFO package in accordance with some embodiments.

Referring to FIG. 8, dummy support dies 80 are placed over release film 22, which is coated on carrier 20. The respective process is illustrated as process 302 in the process flow shown in FIG. 20. Next, referring to FIG. 9A, encapsulating material 86 is formed, which includes dispensing and curing encapsulating material 86. The respective process is illustrated as process 304 in the process flow shown in FIG. 20. A planarization process such as a CMP process or a mechanical grinding process is performed to level the top surface of encapsulating material 86 with the top surfaces of dummy support dies 80. In accordance with alternative embodiments, the formation of encapsulating material 86 and the corresponding planarization process are skipped.

Figure 9A:
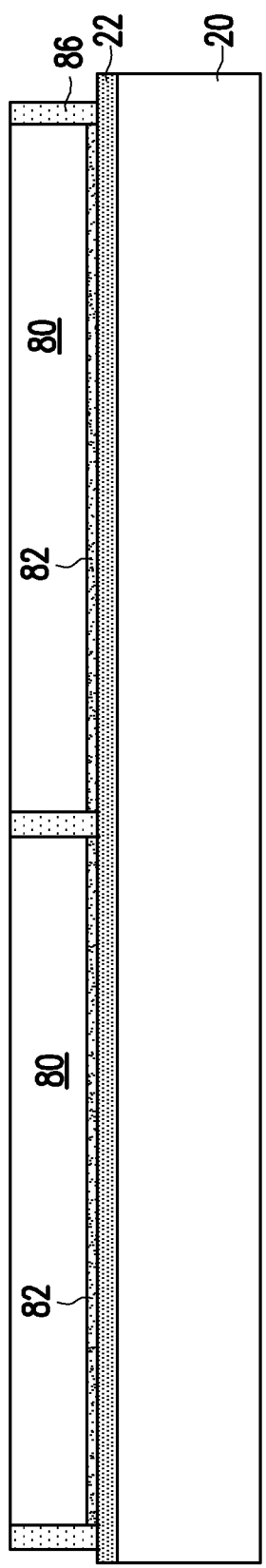
Figure 9B:
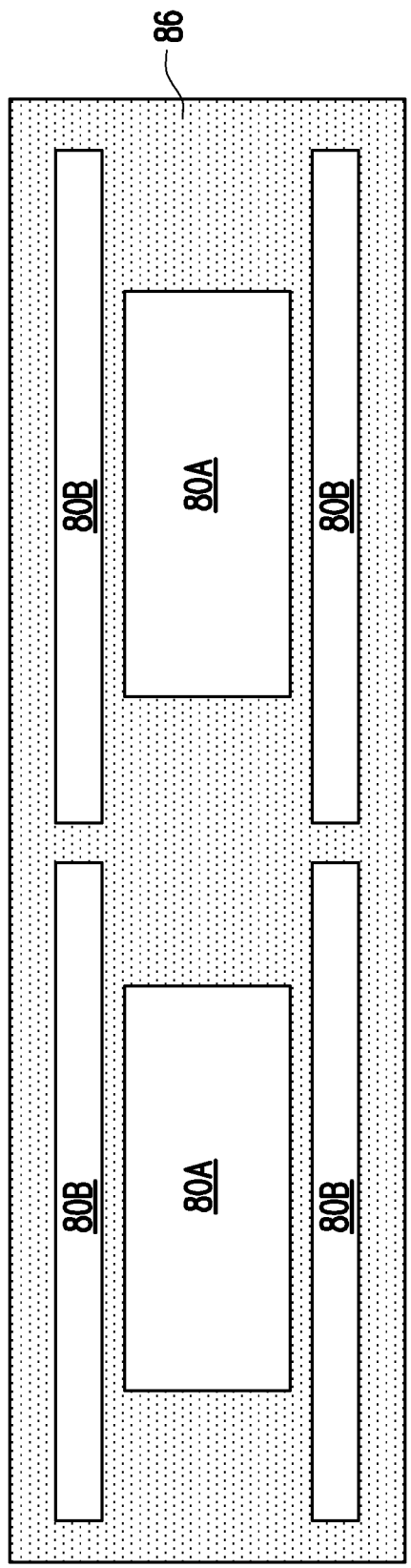

FIG. 9B illustrates a top view of the structure shown in FIG. 9A. In accordance with some embodiments, dummy support dies 80 includes dummy support dies 80A and dummy support dies 80B on the opposite sides of the corresponding dummy support die 80A. Dummy support dies 80B may be more elongated than dummy support die 80A. Dummy support dies 80A and 80B are individually and collectively referred to as dummy support dies 80.

Figure 10:
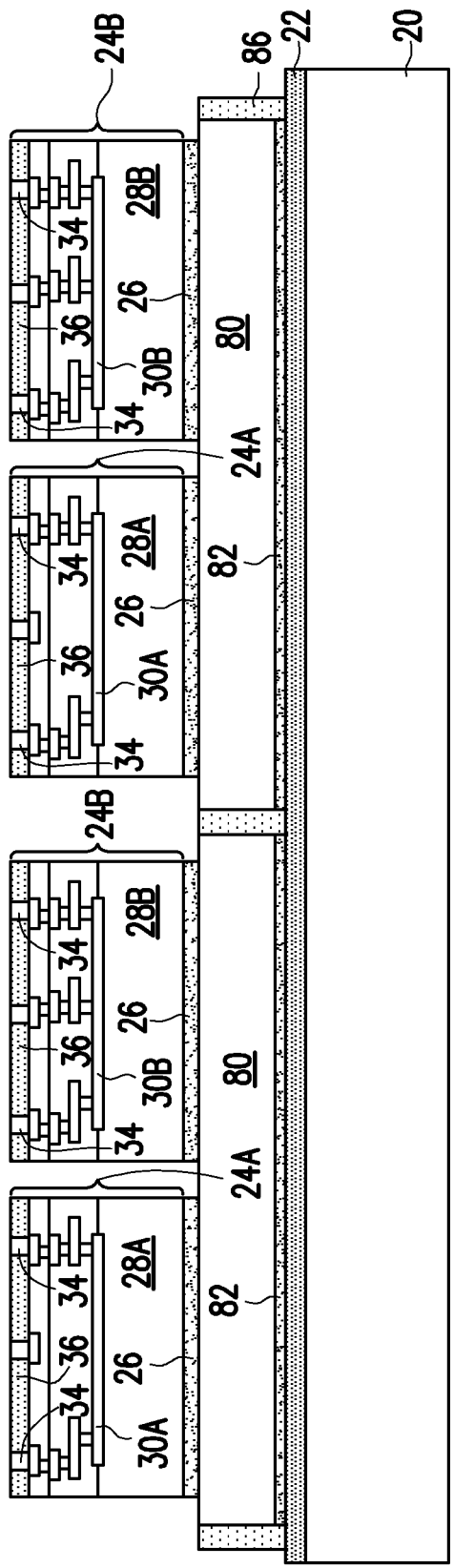

FIG. 10 illustrates the placement of devices (dies) 24A and 24B, which are placed on dummy support dies 80 through DAFs 26. The respective process is illustrated as process 306 in the process flow shown in FIG. 20. In accordance with some embodiments in which encapsulating material 86 has been formed, some parts of device dies 24A and 24B overlap encapsulating material 86. In accordance with other embodiments in which encapsulating material 86 is not formed, some parts of device dies 24A and 24B are suspended at this stage.

Figure 11:
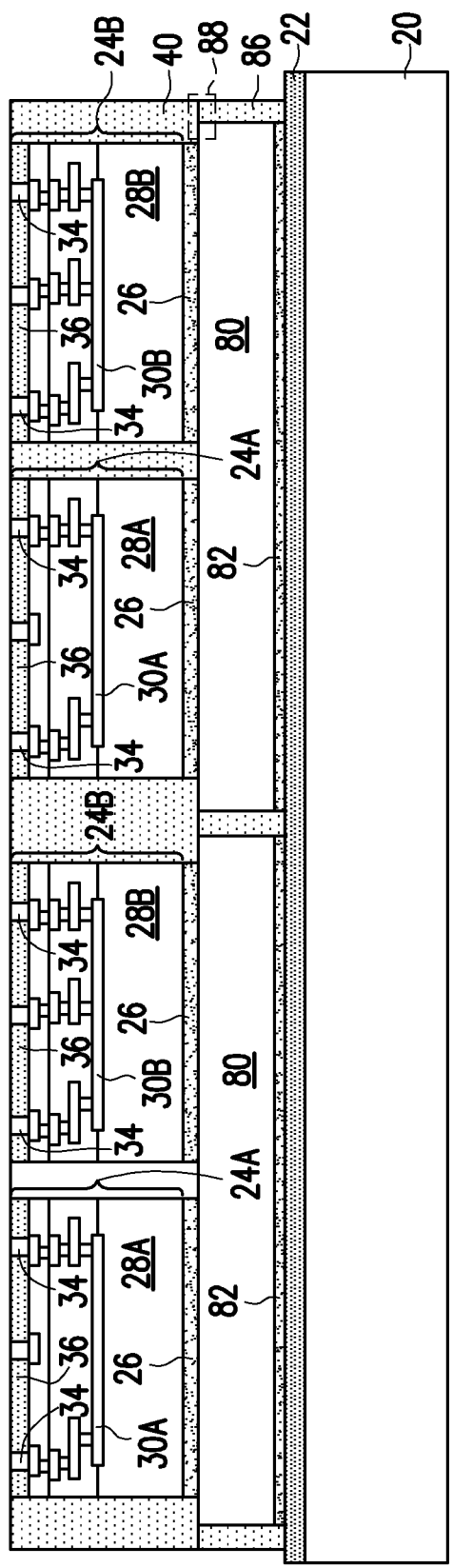
Figure 15:
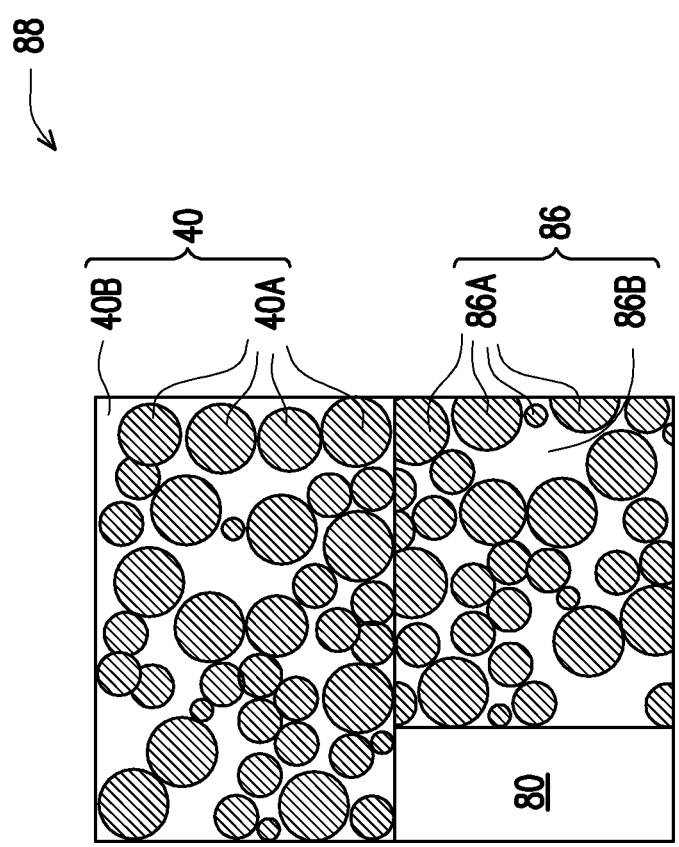
FIG. 15 illustrates an amplified view of a portion of an InFO package as show in FIG. 14A in accordance with some embodiments.

FIG. 11 illustrates the encapsulation of device dies 24A and 24B in encapsulating material 40, which includes dispensing and curing encapsulating material 40, and performing a planarization to reveal metal pillars 34. The respective process is illustrated as process 308 in the process flow shown in FIG. 20. In accordance with some embodiments in which encapsulating material 86 has already been formed, there is a distinguishable interface between encapsulating material 40 and encapsulating material 86. For example, FIG. 15 illustrates an amplified region 88 in FIG. 11. Encapsulating material 86 includes base material 86B and filler particles 86A in base material 86B. Encapsulating material 40 includes base material 40B and filler particles 40A in base material 40B. Since encapsulating material 40 is encapsulated on the planarized encapsulating material 86, and no planarization is performed on the portion of encapsulating material 40 that contacts encapsulating material 86, the spherical particles 40A that are in contact with encapsulating material 86 are rounded, with the rounded surfaces in contact with encapsulating material 86. As a comparison, the portions of encapsulating material 86 in contact with encapsulating material 40 have been planarized in the step shown in FIG. 9A. Accordingly, the spherical particles 86A in contact with encapsulating material 40 are partially cut during the planarization, and hence will have substantially planar top surfaces (rather than rounded top surfaces) in contact with encapsulating material 40.

In accordance with other embodiments in which encapsulating material 86 is not formed, encapsulating material 40 will be filled into the gaps between dummy support dies 80A and 80B. Encapsulating material 40 thus includes a lower portion level with dummy support dies 80A and 80B, and an upper portion level with device dies 24A and 24B. Since the lower portion and the upper portion of encapsulating material 40 are formed in a common process and using a same material, no distinguishable interface exists between the lower portion and the upper portion in accordance with these embodiments.

Figure 12:
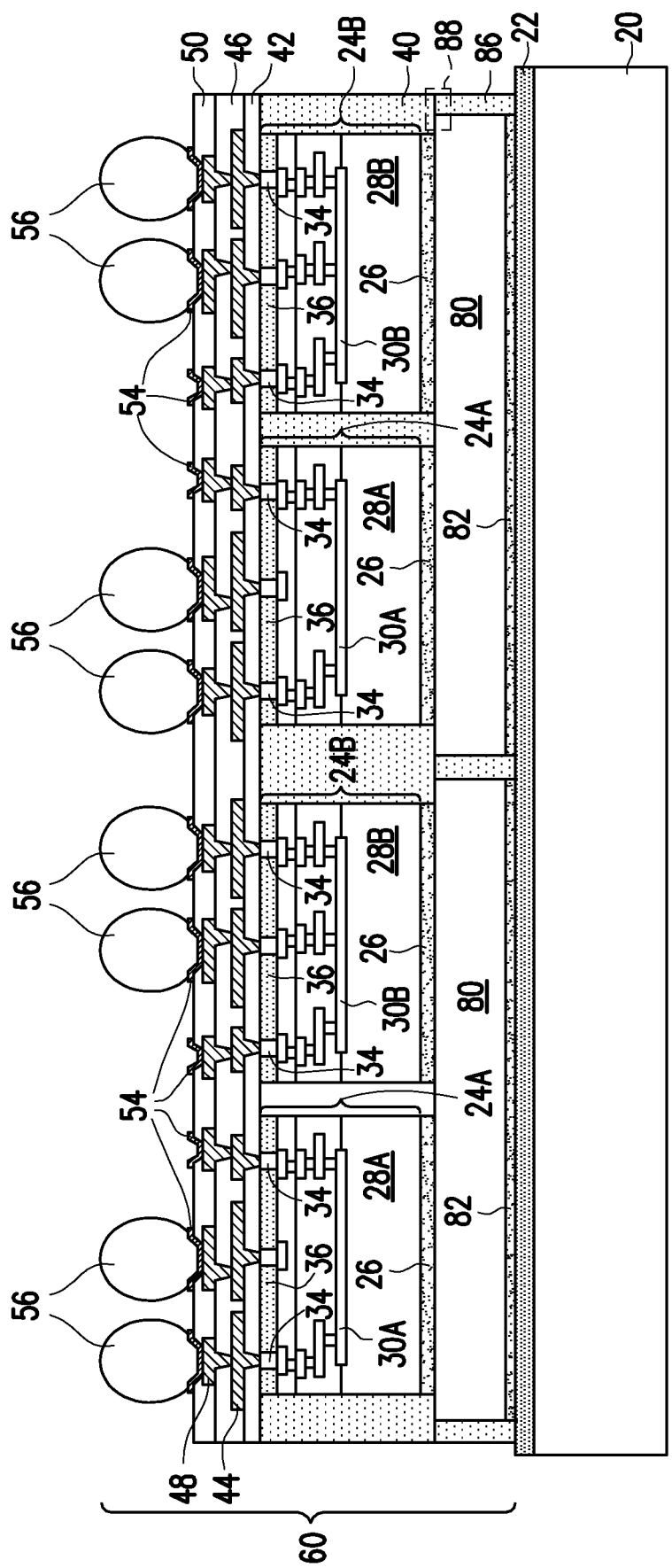
Figure 13:
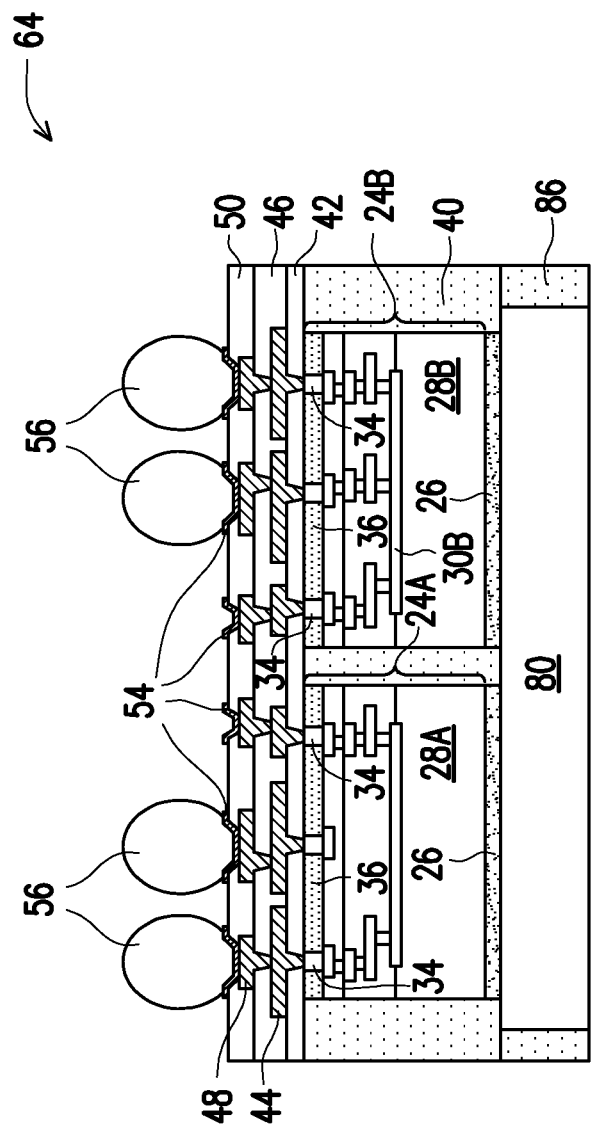

FIG. 12 illustrates the continued formation of composite wafer 60, which includes the formation of dielectric layers 42, 46, and 50, and RDLs 44 and 48. The respective process is illustrated as process 310 in the process flow shown in FIG. 20. UBMs 54 and electrical connectors 56 are also formed. The respective process is illustrated as process 312 in the process flow shown in FIG. 20. In a subsequent step, composite wafer 60 is de-bonded from carrier 20, and is then sawed into individual packages 64. The respective process is illustrated as process 314 in the process flow shown in FIG. 20. One of the resulting packages 64 is illustrate in FIG. 13.

Figure 14A:
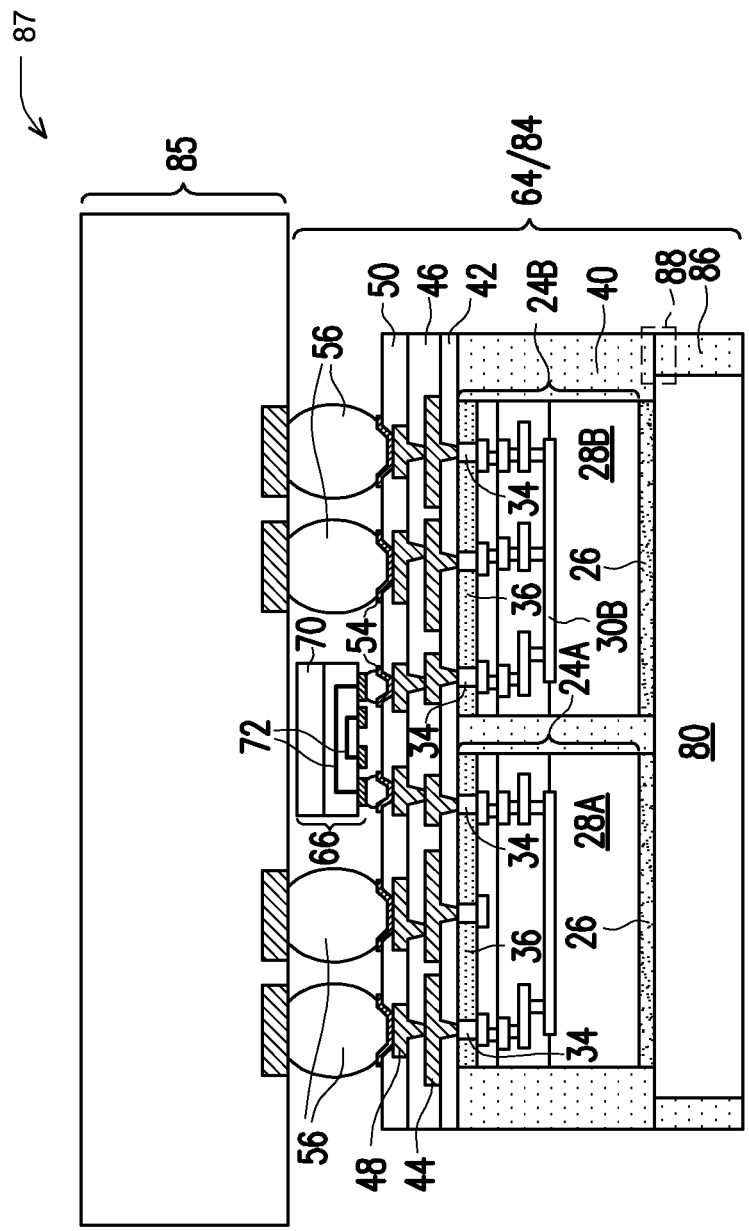
Figure 14B:
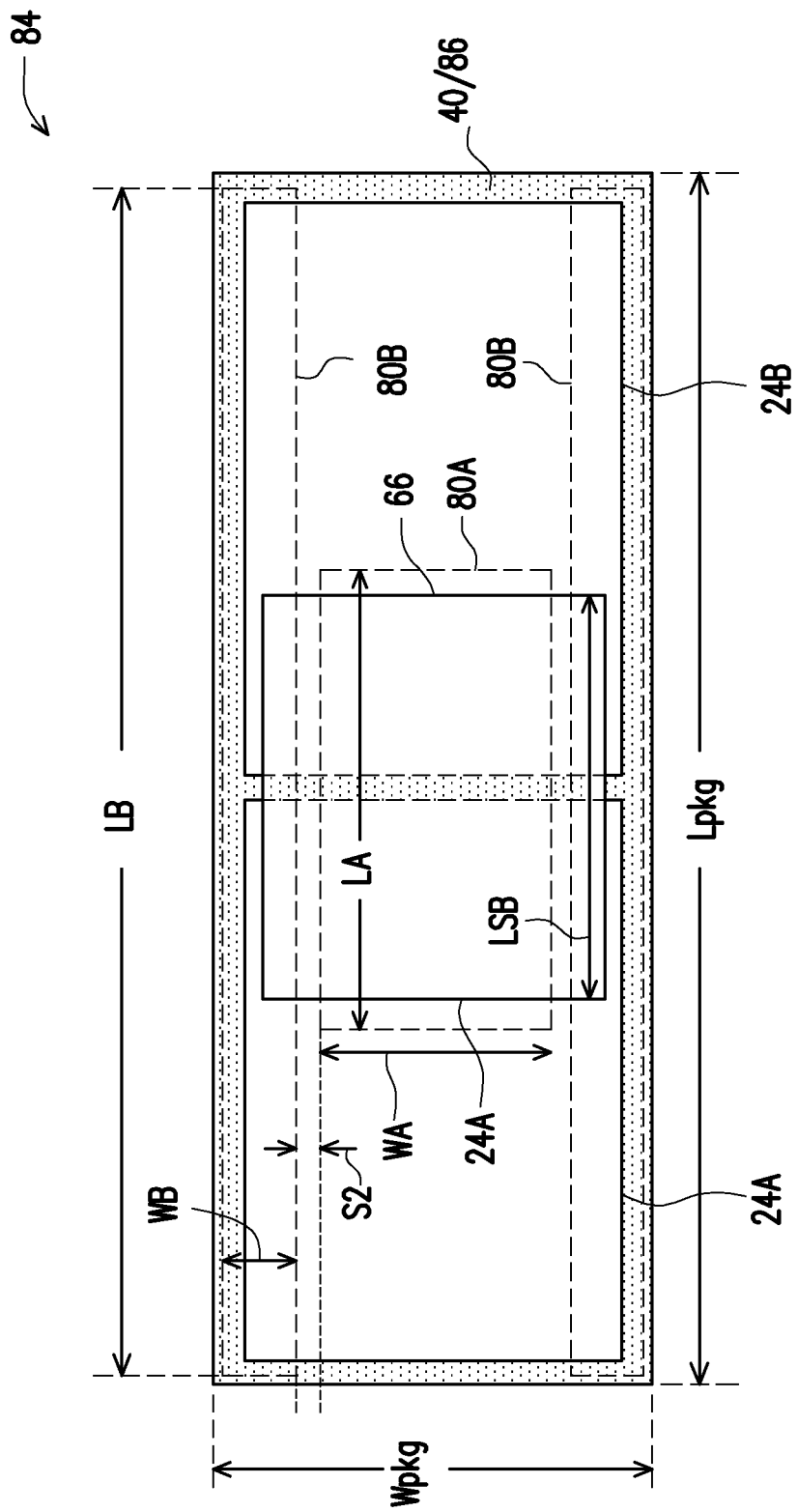
FIG. 14B illustrates a top view of an InFO package as show in FIG. 14A in accordance with some embodiments.

In a subsequent step, as shown in FIG. 14A, bridge die 66 is bonded to package 64 in order to electrically interconnect device die 24A and 24B. The respective process is illustrated as process 316 in the process flow shown in FIG. 20. Package 84 is thus formed. Package 64 is then bonded to package component 85, which may be a package substrate, a printed circuit board, a package, or the like. The resulting package is referred to as package 87. As shown in FIGS. 14A and 14B, encapsulating material 40 (also referred to as encapsulant 40) comprises first apposing edges (the illustrated left edge and right edge). Dummy die 80 comprises second apposing edges (the illustrated left edge and right edge). The first opposing edges of the encapsulant 40 are vertically misaligned from respective second edges of the dummy die 80. Furthermore, encapsulating material 86 (also referred to as encapsulant 86) encircles the dummy die 80, wherein the encapsulant 86 comprises third opposing edges (the illustrated left edge and right edge) vertically aligned to respective ones of the opposing edges of the encapsulant 40.

FIG. 14B illustrates a top view of some portions of package 84. In accordance with some embodiments, there are several dummy support dies 80 in combination supporting the overlying structure. Length LB of dummy support die 80B is smaller than length Lpkg of package 84. The difference Lpkg-LB may be greater than about 50 μm, and may be in the range between about 50 μm and about 100 μm. Width WB of dummy support die 80B may be equal to or greater than about ¼ of width Wpkg of package 84. Width WA of dummy support die 80A may be greater than about 10 μm. Spacing S2 between dummy support dies 80A and 80B may be greater than about 10 μm. The difference (LA-LSB) between length LA of the dummy support die 80A and length LSB of bridge die 66 may be greater than about 100 μm, and may be in the range between about 100 μm and about 200 m.

Adopting a plurality of dummy support dies rather than a single large dummy support die has the advantageous feature of adjusting warpage to desirable values. For example, when package 84 is joined to package component 85 (FIG. 14A), since package component 85 also has warpage during thermal cycles. If package 84 and package component 85 warp toward the same direction (for example, both with the middle portion lower than the edge portions), it may be desirable that package 84 has a same degree of warpage as package component 85, rather than package 84 does not warp at all. This is because if package component 85 warps while package 84 does not warp, cold joints or solder bridging may also occur. Forming three dummy support dies may provide dummy support die 80A directly underlying bridge die 66 to support bridge die 66. On the other hand, the length LB and width WB of dummy support dies 80B may be adjusted to adjust the warping of package 84, so that package 84 and package component 85 have a same degree of warpage in thermal cycles.

Figure 16:
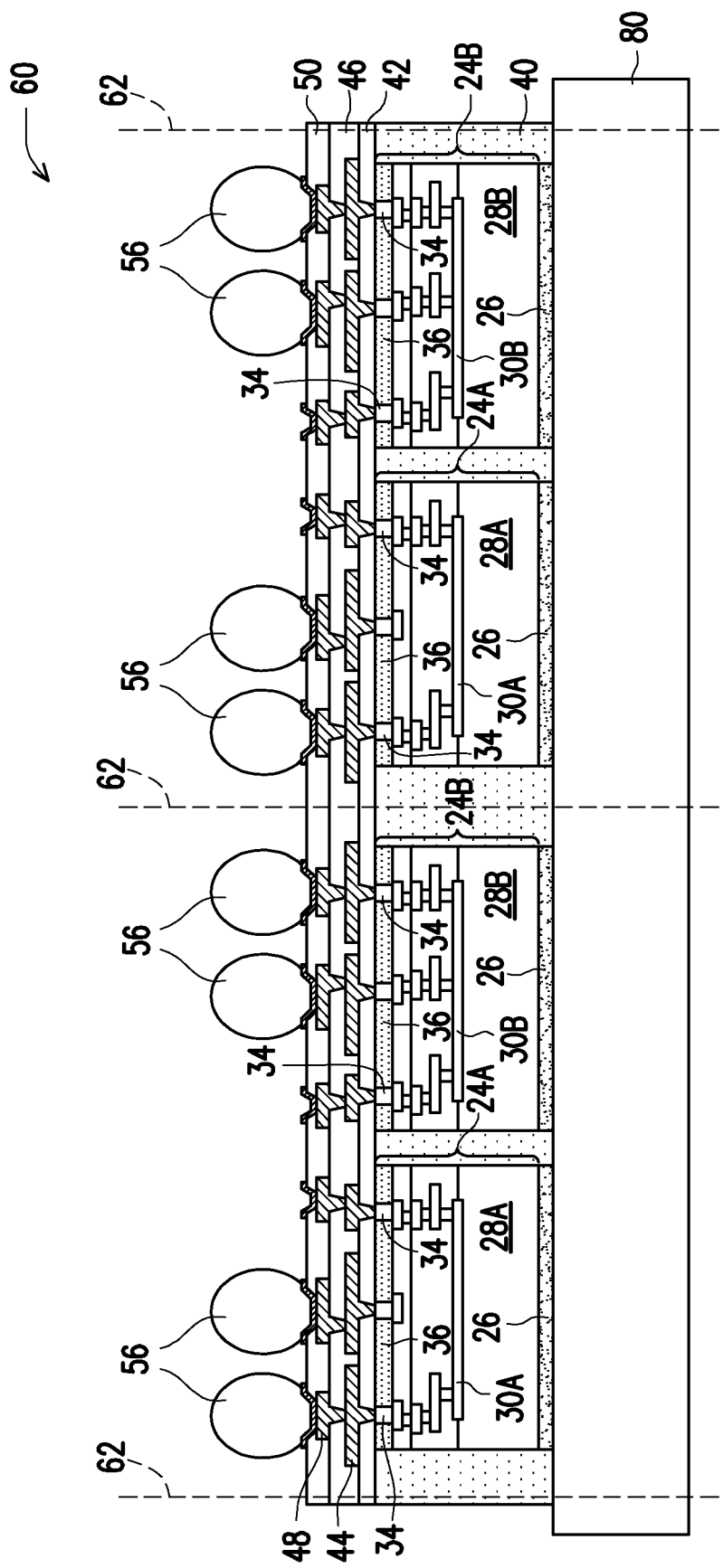
FIGS. 16 through 18 illustrate the cross-sectional views of intermediate stages in the formation of an InFO package in accordance with some embodiments.
Figure 17:
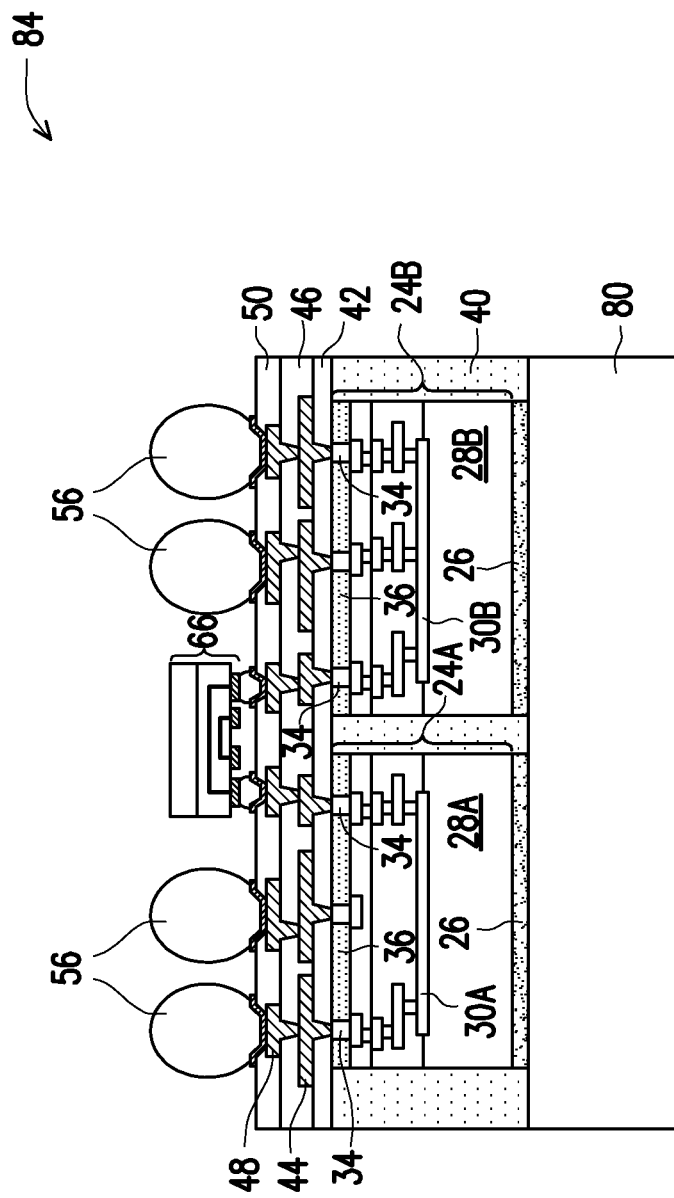
Figure 18:
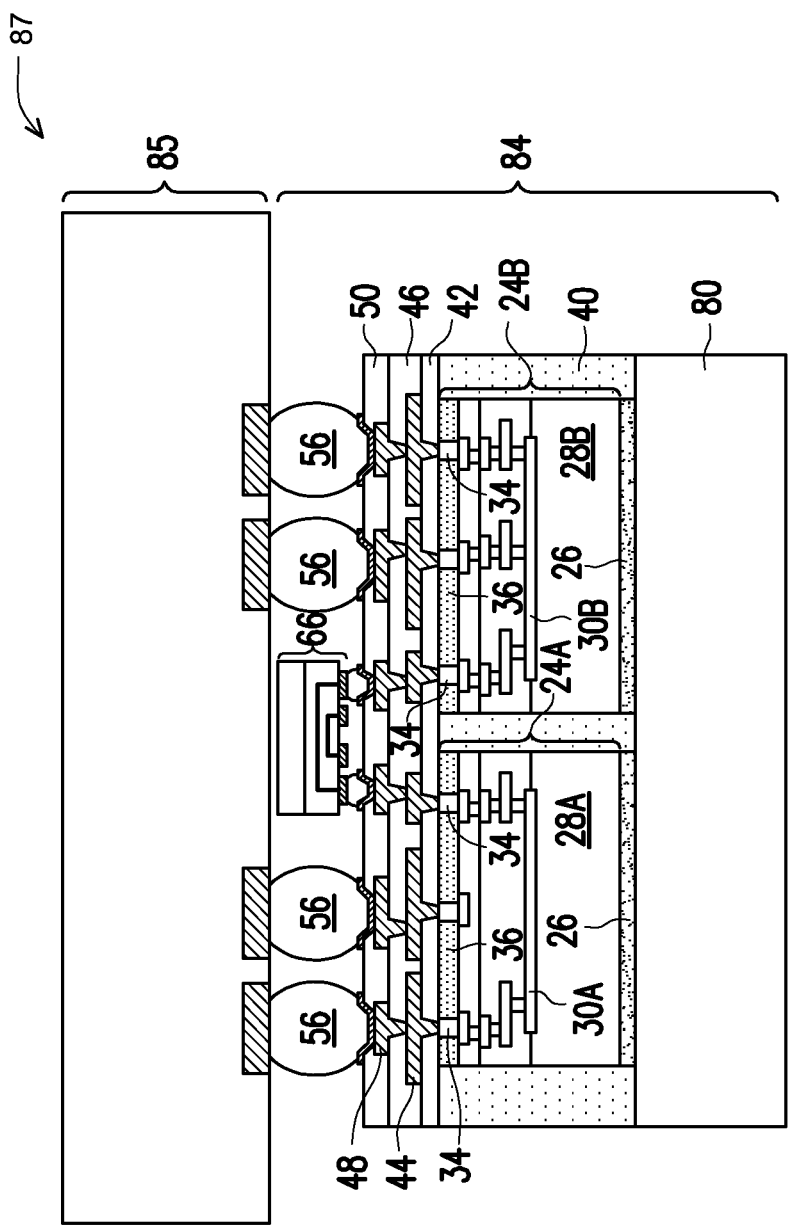

FIGS. 16 through 18 illustrate the intermediate stages in the formation of package 87 in accordance with some embodiments. FIG. 16 illustrates the formation of composite wafer 60. The formation process of composite wafer 60 may be essentially the same as shown in FIGS. 1 through 4, except the carrier 20 as shown in FIGS. 1 through 4 is replaced with support wafer 80 (FIG. 16) to support the overlying device dies 24A and 24B. Also, no release film is formed between support wafer 80 and overlying DAFs 26.

The process details, the structures, and the materials for forming the package 84 as shown in FIG. 16 may be found in the discussion referring to FIGS. 1 through 4, and are not repeated herein. After the reconstructed wafer 60 as shown in FIG. 16 is formed, a die-saw process is performed along scribe lines 62, resulting in the package 84 as shown in FIG. 17. When the respective composite (reconstructed) wafer 60 (FIG. 16) is sawed, support wafer 80 is sawed also, and a piece of support wafer 80 is left in the resulting package 84. The piece of support wafer 80 is also referred to as support die 80. In accordance with some embodiments of the present disclosure, the material of support wafer/die 80 is selected from the same group of candidate materials as discussed in preceding embodiments. The thicknesses of support die 80 and the overlying device dies 24A/24B may be similar to what are discussed in preceding paragraphs, and are not repeated herein. Since support wafer 80 is sawed along with the overlying encapsulating material 40, the edges of support die 80 are flush with the respective edges of encapsulating material 40. Also, DAFs 26 may have opposite surfaces contacting support die 80 and device dies 24A/24B.

Referring to FIG. 18, package 84 is bonded to package component 85, which may be a package substrate, a printed circuit board, a package, or the like. The resulting package is referred to as package 87.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. Multi-stacking packages may become very thin. The thin multi-stacking packages suffer from warpage, and the warpage is worsened when elongated device dies are used. Accordingly, a rigid dummy support die(s) is added into the multi-stacking package to provide mechanical support, so that the warpage is reduced. The dummy support die is also formed of a material having a good thermal conductivity, so that the dummy support die can readily conduct heat out of the package, and the thermal dissipation of the multi-stacking package is improved.

In accordance with some embodiments of the present disclosure, a method includes encapsulating a first device die and a second device die in an encapsulating material, forming redistribution lines over and electrically coupling to the first device die and the second device die, and bonding a bridge die over the redistribution lines to form a package, with the package including the first device die, the second device die, and the bridge die. The bridge die electrically inter-couples the first device die and the second device die. The first device die, the second device die, and the bridge die are supported with a dummy support die. In an embodiment, the supporting comprises attaching the dummy support die to the package through an adhesive. In an embodiment, the method further includes sawing through the encapsulating material to form the package, wherein the dummy support die is attached to the package after the sawing. In an embodiment, the dummy support die extends beyond a first edge and a second edge of the package, and the dummy support die comprises opposite edges flush with a third edge and a fourth edge of the package, with the third edge and the fourth edge parallel to each other and perpendicular to the first edge and the second edge. In an embodiment, the dummy support die extends beyond four edges of the package in four directions. In an embodiment, the dummy support die comprises a blank silicon die. In an embodiment, the dummy support die comprises a metal die. In an embodiment, the method further comprises placing the dummy support die on a carrier; encapsulating the dummy support die in an additional encapsulating material; and placing the first device die and the second device die on the dummy support die and the additional encapsulating material.

In accordance with some embodiments of the present disclosure, a method includes encapsulating a first device die and a second device die in an encapsulating material; forming redistribution lines over the first device die and the second device die; forming electrical connectors overlying and electrically coupling to the first device die and the second device die through the redistribution lines; performing a singulation on the encapsulating material, wherein the first device die and the second device die are sawed into a package; and attaching the package to a dummy support die. In an embodiment, the dummy support die extends beyond edges of the package in each of four lateral directions. In an embodiment, in a top view of the package, the package is elongated and comprising a long edge and a short edge perpendicular to, and shorter than, the long edge, and the dummy support die extends beyond the short edge, and has edges flush with the long edge. In an embodiment, the method further comprises bonding a bridge die to the package, wherein the bridge die is on an opposite side of the redistribution lines than the first device die and the second device die. In an embodiment, the dummy support die comprises a dummy silicon die. In an embodiment, the dummy support die comprises a metal die.

In accordance with some embodiments of the present disclosure, a package includes a first device die; a second device die; a first encapsulating material encapsulating the first device die and the second device die therein; a plurality of redistribution lines over and electrically coupling to the first device die and the second device die; a bridge die over and bonded to the redistribution lines, wherein the bridge die electrically intercouples the first device die and the second device die; and a dummy support die underlying and attached to the first device die and the second device die. In an embodiment, the bridge die comprises a first portion overlapping the first device die; and a second portion overlapping the second device die. In an embodiment, the package further comprises an adhesive film attaching the first device die and the second device die to the dummy support die. In an embodiment, the package further comprises a second encapsulating material encapsulating the dummy support die therein. In an embodiment, the first encapsulating material contacts the second encapsulating material, with a distinguishable interface therebetween. In an embodiment, the dummy support die extends laterally beyond an edge of the first encapsulating material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a first dummy die free from active devices and passive devices therein, wherein the first dummy die comprises first opposing edges;
   a first die-attach film over and attached to the first dummy die;
   a first device die over and contacting the first die-attach film;
   a first encapsulant encapsulating the first die-attach film and the first device die therein, wherein the first encapsulant comprises second opposing edges, and wherein the second opposing edges are vertically misaligned from respective ones of the first opposing edges; and a redistribution structure over and electrically connecting to the first device die, wherein the redistribution structure further overlaps the first encapsulant.

2. The package of claim 1, wherein the first encapsulant extends laterally beyond the first opposing edges of the first dummy die.

3. The package of claim 2 further comprising a second encapsulant encircling the first dummy die, wherein the second encapsulant comprises third opposing edges vertically aligned to respective ones of the second opposing edges of the first encapsulant.

4. The package of claim 3, wherein the first encapsulant is in physical contact with the second encapsulant.

5. The package of claim 1, wherein the first dummy die extends laterally beyond the second opposing edges of the first encapsulant.

6. The package of claim 5 further comprising an adhesive film adhering the first die-attach film to the first dummy die.

7. The package of claim 1 further comprising:
 a solder region over and electrically connected to the first device die through the redistribution structure; and
 a package component bonding to the redistribution structure through the solder region, wherein the first dummy die and the package component are on opposite sides of the first device die.

8. The package of claim 1 further comprising a second dummy die, wherein the first die-attach film is over and attached to both of the first dummy die and the second dummy die.

9. The package of claim 8 further comprising a second device die, wherein both of the first device die and the second device die are over and attached to the first dummy die.

10. The package of claim 1, wherein the first dummy die is a silicon die.

11. The package of claim 1, wherein edges of the first die-attach film are flush with edges of the first device die.

12. A package comprising:
 a blank die formed of a homogeneous material;
 a first die-attach film over and attached to the blank die;
 a first package component overlapping and attached to the first die-attach film;
 a second die-attach film over and attached to the blank die;
 a second package component overlapping and attached to the second die-attach film; and
 a molding compound molding the first package component and the second package component therein, wherein the blank die extends laterally beyond opposing edges of the molding compound.

13. The package of claim 12 further comprising an adhesive film adhering both of the first die-attach film and the second die-attach film to the blank die.

14. The package of claim 13, wherein the molding compound and the adhesive film have corresponding edges vertically aligned.

15. The package of claim 12, wherein the first die-attach film and the second die-attach film are discrete die-attach films.

16. The package of claim 12, wherein the first die-attach film and the second die-attach film comprise bottom surfaces contacting a top surface of the blank die.

17. The package of claim 12, wherein the blank die comprises a silicon die.

18. A package comprising:
 a first package component comprising:
  a device die;
  a first molding compound molding the device die therein; and
  a redistribution structure comprising dielectric layers and redistribution lines, wherein the redistribution lines are electrically connected to the device die, and wherein the dielectric layers overlap both of the device die and the first molding compound;
 a support die underlying and attached to the first package component; and
 a second molding compound molding the support die therein, wherein first edges of the first molding compound are vertically aligned to second edges of the second molding compound.

19. The package of claim 18, wherein the support die is a blank die formed of a homogeneous material.

20. The package of claim 18 further comprising a die-attach film between and contacting the support die and the device die.

* * * * *